(12) United States Patent
Ide et al.

(10) Patent No.: US 9,049,806 B2
(45) Date of Patent: Jun. 2, 2015

(54) INTEGRATED DEVICE AND MANUFACTURING METHOD

(75) Inventors: Masafumi Ide, Tokorozawa (JP); Toru Takizawa, Musashimurayama (JP); Kaoru Yoda, Kitasaku-gun (JP)

(73) Assignee: CITIZEN HOLDINGS CO., LTD., Tokyo (JP)

( * ) Notice: Subject to any disclaimer, the term of this patent is extended or adjusted under 35 U.S.C. 154(b) by 826 days.

(21) Appl. No.: 12/949,488

(22) Filed: Nov. 18, 2010

(65) Prior Publication Data

US 2011/0122481 A1 May 26, 2011

(30) Foreign Application Priority Data

Nov. 20, 2009 (JP) ................. 2009-265055

(51) Int. Cl.
| | |
|---|---|
| G02F 2/02 | (2006.01) |
| G02B 6/12 | (2006.01) |
| H05K 3/32 | (2006.01) |
| G02B 6/42 | (2006.01) |
| H05K 1/11 | (2006.01) |
| G02F 1/35 | (2006.01) |
| H01S 5/022 | (2006.01) |
| H05K 1/02 | (2006.01) |
| H05K 1/03 | (2006.01) |

(52) U.S. Cl.
CPC .............. *H05K 3/32* (2013.01); *G02B 6/12007* (2013.01); *G02B 6/4215* (2013.01); *G02B 6/4232* (2013.01); *G02F 2001/3505* (2013.01); *H01S 5/02248* (2013.01); *H01S 5/02272* (2013.01); *H01S 5/02276* (2013.01); *H05K 1/0274* (2013.01); *H05K 1/0306* (2013.01); *H05K 1/111* (2013.01); *H05K 2201/0373* (2013.01); *H05K 2201/09745* (2013.01); *H05K 2201/10121* (2013.01); *H05K 2201/10674* (2013.01); *H05K 2203/0369* (2013.01); *H05K 2203/095* (2013.01)

(58) Field of Classification Search
None
See application file for complete search history.

(56) References Cited

U.S. PATENT DOCUMENTS

| | | | |
|---|---|---|---|
| 5,802,222 A * | 9/1998 | Rasch et al. ................. 385/1 |
| 6,141,366 A * | 10/2000 | Yoneda ................. 372/50.1 |
| 6,829,390 B2 | 12/2004 | Bucher et al. | |
| 6,829,398 B2 | 12/2004 | Ouchi | |
| 7,100,279 B2 * | 9/2006 | Suga et al. ................. 29/840 |
| 2003/0039455 A1 | 2/2003 | Ouchi | |
| 2006/0177173 A1* | 8/2006 | Shastri et al. ................. 385/14 |
| 2007/0223935 A1* | 9/2007 | Asai et al. ................. 398/164 |

(Continued)

FOREIGN PATENT DOCUMENTS

| | | |
|---|---|---|
| CN | 1402030 A | 3/2003 |
| CN | 101017956 A | 8/2007 |

(Continued)

OTHER PUBLICATIONS

T. Suga et al, "Surface Activated Bonding and Its Application on Micro-Bonding at Room Temperature", European Hybrid Microelectronics Conference, Jun. 9, 1993, pp. 314-321.*

(Continued)

*Primary Examiner* — Hemang Sanghavi
(74) *Attorney, Agent, or Firm* — Sughrue Mion, PLLC

(57) ABSTRACT

An integrated device includes an optical element and an electrical element that are implemented on a substrate. The optical element and the electrical element are bonded by surface-activated bonding technology to a bonding portion that is formed on the substrate and made of metal material.

8 Claims, 11 Drawing Sheets

(56) References Cited

U.S. PATENT DOCUMENTS

| | | | |
|---|---|---|---|
| 2008/0150155 A1* | 6/2008 | Periaman et al. | 257/777 |
| 2008/0245843 A1 | 10/2008 | Suga et al. | |
| 2009/0067779 A1* | 3/2009 | Furuyama | 385/14 |
| 2009/0159997 A1* | 6/2009 | Okudo et al. | 257/415 |

FOREIGN PATENT DOCUMENTS

| | | |
|---|---|---|
| JP | 62-76695A A | 4/1987 |
| JP | 2000-323649 | 11/2000 |
| JP | 2005-311298 A | 11/2005 |
| JP | 2007-072206 A | 3/2007 |
| JP | 2009-105254 A | 5/2009 |
| WO | 2008/094642 A1 | 8/2008 |

OTHER PUBLICATIONS

Takigawa et al, "Low-temperature Bonding of Laser Diode Chips on Si Substrates with Oxygen and Hydrogen Atmospheric-pressure Plasma Activation", Aug. 10-13, 2009, International Conference of Electronic Packaging Technology & High Density Packaging, IEEE pp. 475-477.*

Chinese Office Action dated Sep. 21, 2012, issued in CN Application No. 201010557803.9.

Japanese Office Action dated Jul. 2, 2013, issued in Japanese Patent Application No. 2009-265055 with partial English Translation.

Japanese Office Action dated Apr. 2, 2013 issued in Japanese Patent Application No. 2009265055.

* cited by examiner

INTEGRATED DEVICE AND MANUFACTURING METHOD

BACKGROUND OF THE INVENTION

1. Field of the Invention

The embodiments discussed herein are related to an integrated device having optical elements and electrical elements disposed on the same substrate, and a manufacturing method of the integrated device.

2. Description of the Related Art

Conventionally, a module is known in which an optical element such as a laser element and an electrical element such as an IC are disposed in a mixed manner on the same substrate (see, for example, Japanese Laid-Open Patent Publication No. 2007-72206). In the module described in Japanese Laid-Open Patent Publication No. 2007-72206, an optical element and an electrical element controlling the optical element are implemented on a substrate made of silicon (Si), for example. An optical waveguide may be formed on the substrate so as to be optically coupled to the optical element and to guide light to the outside.

In the module described in Japanese Laid-Open Patent Publication No. 2007-72206, the optical element and the electrical element are implemented on the substrate by flip-chip bonding. That is, the elements are implemented by forming bumps on the bottom surface of the optical element and the electrical element, contacting the bumps with the electrodes of the substrate, and applying heat and pressure for metal bonding.

Other than the module above, a technology is known in which an optical element such as a laser element is bonded to a substrate by surface-activated bonding (see, for example, Japanese Laid-Open Patent Publication No. 2005-311298). The surface-activated bonding, in short, is a method of low temperature bonding, employing the cohesion of atoms by activating the surface of a material by using, for example, plasma processing to remove an inactive layer such as an oxide film and contaminants covering the surface and bringing atoms having a high surface energy into contact with each other.

However, if functional elements made of different materials are disposed in a mixed manner on the described integrated device to obtain an advanced integrated device, precise optical coupling of the optical element disposed on the substrate and the optical waveguide formed on the substrate cannot be achieved due to poor alignment of the optical axes caused by cumulative deformation of the substrate with the optical waveguide due to the thermal history. In particular, as the number of optical elements and electrical elements disposed in a mixed manner increases, the number of processing steps increases, causing greater deformation of the substrate due to heat processing and thereby preventing a precise optical coupling of the optical element disposed on the substrate and the optical waveguide formed on the substrate. That is, an accuracy of submicrons in the positioning of the optical element and the optical waveguide, which is required for precise optical coupling, cannot be achieved.

If the optical element and the electrical element are implemented by flip-chip bonding as described in Japanese Laid-Open Patent Publication No. 2007-72206, since the optical element, the electrical element, and the substrate are thermally processed, positions of the components may deviate due to the difference in the coefficient of thermal expansion of each component.

If the optical element is bonded by surface-activated bonding as described in Japanese Laid-Open Patent Publication No. 2005-311298 after the electrical element has been implemented by flip-chip bonding, since the substrate is heated when the electrical element is implemented, the substrate becomes warped and the precision of the positioning of the optical element during the surface-activated bonding can be adversely affected.

Additionally, if the electrical element is implemented on the substrate by flow soldering, reflow soldering, etc., the same problem occurs since the electrical element and the substrate are heated. Thus, the precision in the positioning of the optical element and the electrical element disposed on the substrate of the conventional integrated device cannot be improved. Similarly, the conventional integrated device cannot achieve a precise optical coupling of the optical element disposed on the substrate and the optical waveguide formed on the substrate.

SUMMARY OF THE INVENTION

It is an object of the present invention to at least solve the above problems in the conventional technologies.

An integrated device according to one aspect of the present invention includes an optical element and an electrical element that are implemented on a substrate. The optical element and the electrical element are bonded by surface-activated bonding technology to a bonding portion that is formed on the substrate and made of metal material.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Preferred embodiments of an integrated device and a manufacturing method thereof according to the present invention are described in detail with reference to the accompanying drawings.

The integrated device according to the present invention achieves a hybrid optoelectronic integrated circuit in which optical elements such as a laser diode (LD), a waveguide, an LD driver, a light receiving element, and an LSI for data processing made of Si, etc., are disposed in a mixed manner on a silicon substrate (Si platform). The silicon substrate preferably includes electrical wiring, a logic LSI, and a temperature sensor, and has a planarized surface on which a waveguide functioning as an optical line/circuit is formed.

If this Si platform is to be used to implement a function basically for an engine of a pico projector, for example, an LD, a wavelength conversion element with a waveguide of lithium niobate (PPLN, LiNbO$_3$) for converting the wavelength of light as necessary, and a PD for output adjustment are disposed on the Si platform as optical elements, along with package components such as an LD driver, an LSI for image processing, and a communication LSI as electrical elements.

Generally, the coefficient of thermal expansion and the thermal conductivity significantly differ if these devices disposed in a mixed manner are made of different materials. The present invention forms microbumps on metal electrodes formed on the substrate, and implements an optoelectronic element by surface-activated bonding. Thus, each element can be bonded on the substrate at a lower temperature (for example, room temperature) as compared to prior arts, thereby preventing peeling and/or cracking at the bonding surface irrespective of the different materials of devices disposed in a mixed manner and the order in which the devices are mounted to the substrate.

Figure 1:
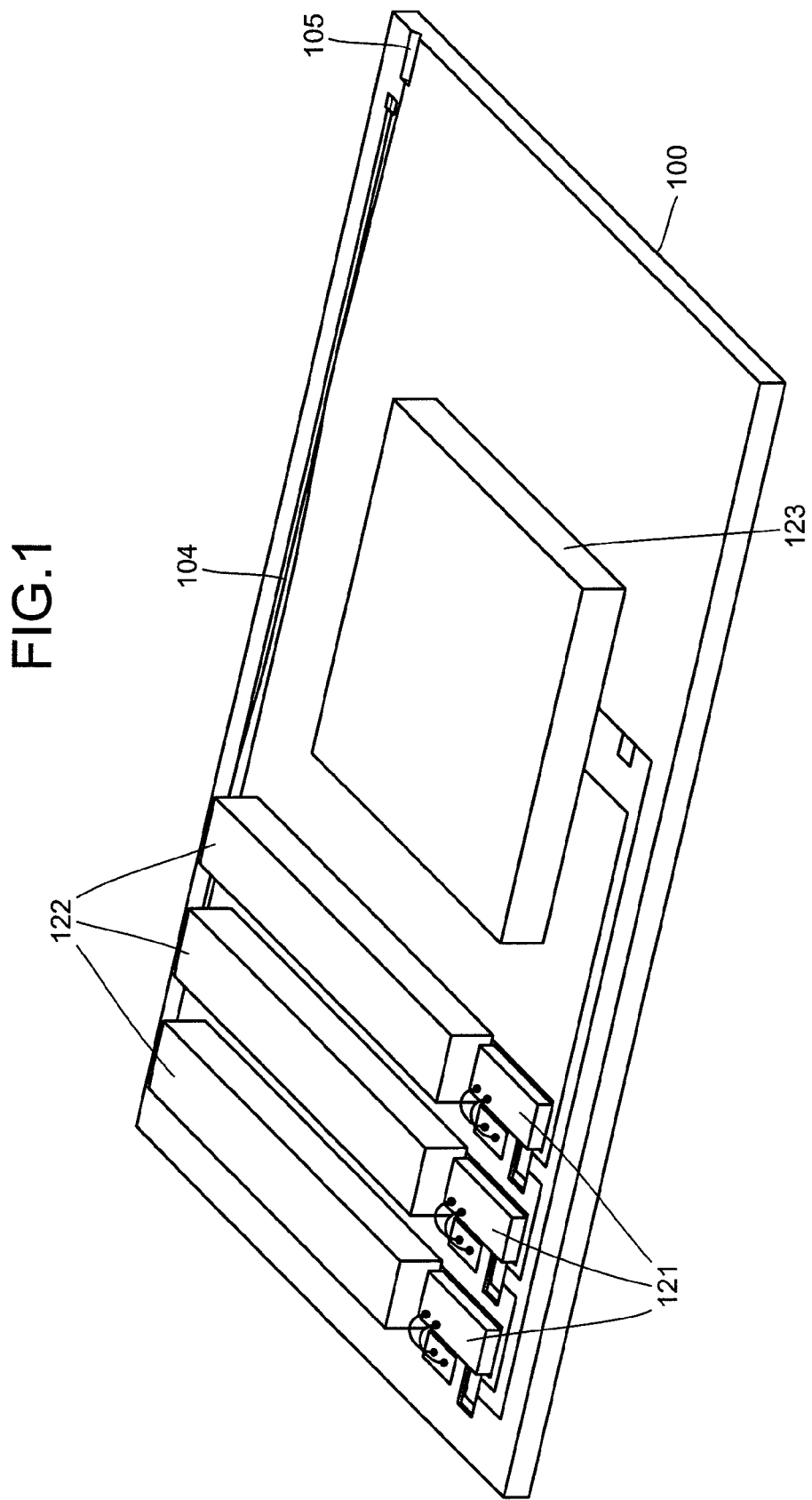
FIG. 1 is a perspective view of an integrated device according to an embodiment.

FIG. 1 is a perspective view of an integrated device according to an embodiment. Various components are disposed in a mixed manner on a planar substrate 100 made of Si. In the example depicted in this figure, LDs 121, wavelength conversion elements 122 for wavelength conversion of light output from the LDs 121, and a driver IC 123 for the LDs 121 and the wavelength conversion elements 122, etc. are disposed.

The LDs 121 are made of GaAs, GaN, etc., and three LDs are arranged corresponding to the three primary colors of light R, G, and B. The wavelength conversion elements 122 are arranged along lines for R, G, and B, and convert light into R, G, and B, respectively. Alternatively, no wavelength conversion element 122 is arranged along the line for R, for example, whereby the R component of the LD 121 is output directly.

Further, a waveguide 104 functioning as an optical circuit that guides the light output from the wavelength conversion elements 122 to a port 105 is formed on the substrate 100 after a given planarization process. The substrate 100 has been preliminarily equipped with CMOS LSIs (integrated circuits) such as a CPU and a memory, electrical wiring, and a temperature sensor, etc. (not shown). Preferably, components that generate heat due to power consumption such as a driver IC, a video processor, and a MEMS driver are arranged on the substrate 100, while a logic element is arranged inside the substrate 100. A heat sink for heat dissipation is provided on the underside of the substrate 100.

Figure 2:
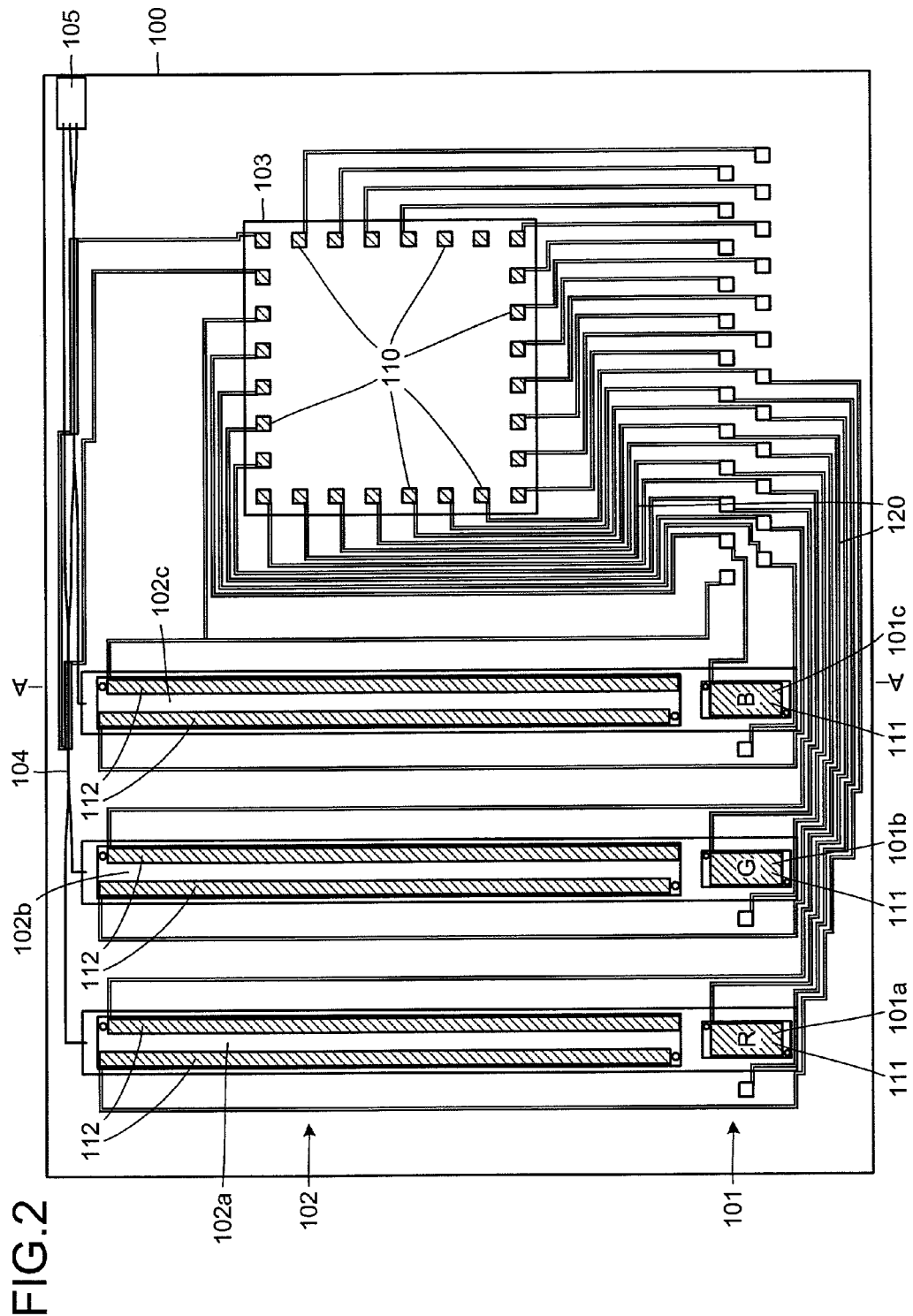
FIG. 2 is a plan view of the integrated device according to the embodiment.

FIG. 2 is a plan view of the integrated device according to the embodiment, and depicts a state without the components in the configuration depicted in FIG. 1. In an LD area 101, three LD areas 101a to 101c are formed corresponding to the three primary colors of light R, G, and B. In a wavelength-conversion-element area 102, wavelength-conversion-element areas 102a to 102c are formed along the lines for R, G, and B, respectively.

In a driver-IC area 103, bonding portions 110 are formed at positions of electrodes of the driver IC. The bonding portions 110 are bonded to the electrodes of the driver IC, and are connected to the LD area 101 and the wavelength-conversion-element area 102 by wiring patterns 120. Similarly, in the LD area 101 and in the wavelength-conversion-element area 102, bonding portions 111 and 112 are formed at positions of electrodes of the LDs and at positions of electrodes of the wavelength conversion elements. The LDs, the wavelength conversion elements, and the driver IC are disposed respectively in the LD area 101, the wavelength-conversion-element area 102, and the driver-IC area 103 by surface-activated room-temperature bonding, the details of which are described later.

Figure 3:
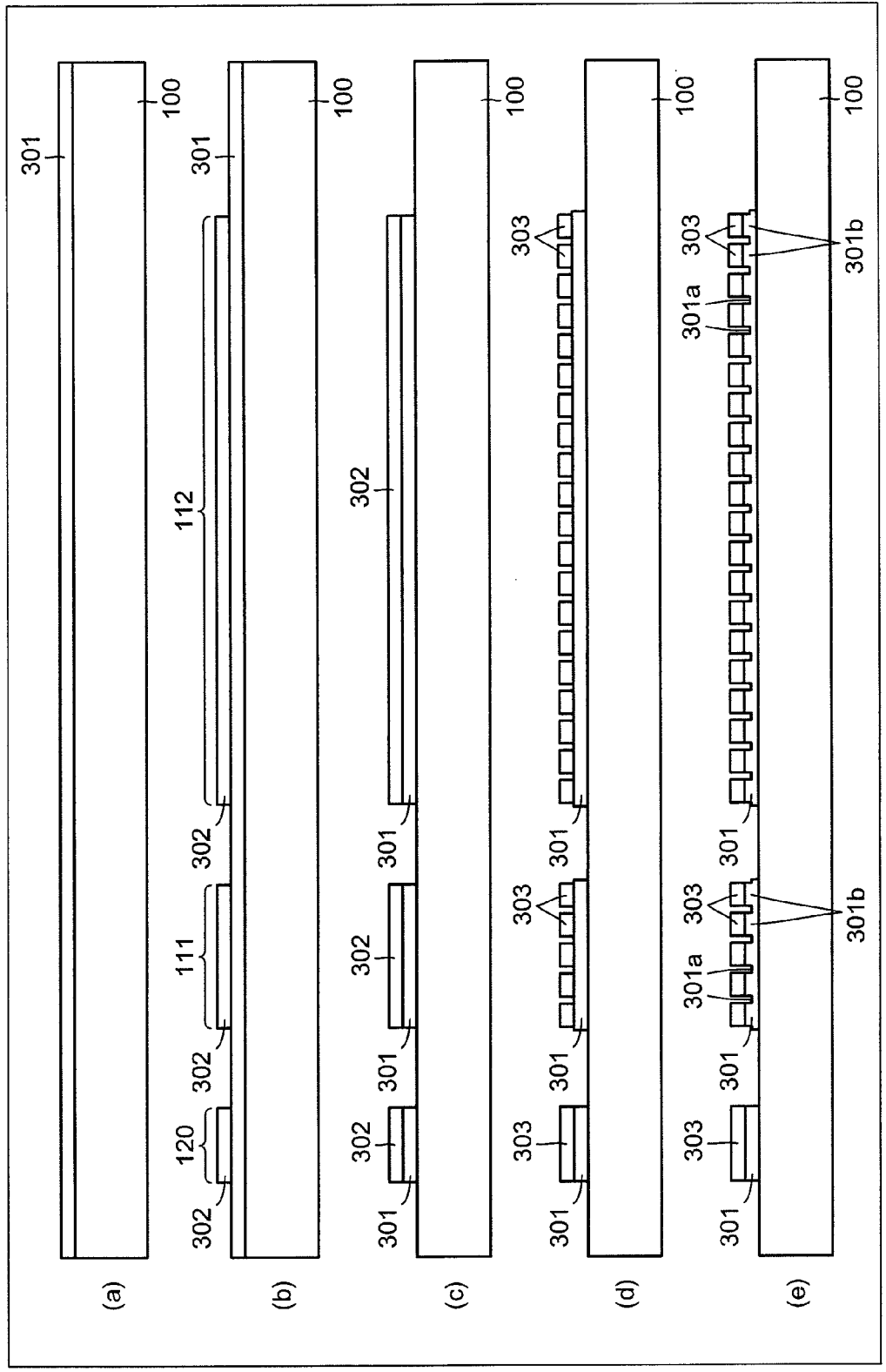
FIG. 3 is a diagram of a first example of a manufacturing process of forming microbumps at the bonding portions.

FIG. 3 is a diagram of a first example of a manufacturing process of forming microbumps at the bonding portions and depicts a cross section along A-A line of FIG. 2. The LD area 101, the wavelength-conversion-element area 102, and the wiring patterns 120 are provided on the substrate 100.

At step (a), an Au film 301 made of gold is formed on the substrate 100 of Si, planarized through a formation process of CMOS LSI. At step (b), resist films 302 are formed on portions to remain as electrodes. The electrodes are the bonding portions 110, 111, and 112 described above and in the example depicted in the figure, correspond to the bonding portions 111 and 112 and the wiring patterns 120 depicted in FIG. 2.

At step (c), the Au film 301 is removed by etching portions not covered by the resist films 302 to form electrodes. Among the electrodes, on the bonding portions 111 and 112 where components are to be implemented, resist films 303 for microbumps are formed at step (d). Further, a resist film 303 is formed on the entire surface of the Au film 301 at the portion to remain as the wiring patterns 120.

At step (e), grooves 301a of a given depth are formed by half etching between resist films 303 on the bonding portions 111 and 112. After the resist films 303 are removed, microbumps 301b are formed on the bonding portions 111 and 112. The bonding portions 111 and 112 are entirely conductive as electrodes even after the formation of the microbumps 301b, since the underside of the microbumps 301b are connected by the Au film 301. The portion for the wiring patterns 120 remains planar since no microbumps are formed.

Figure 4:
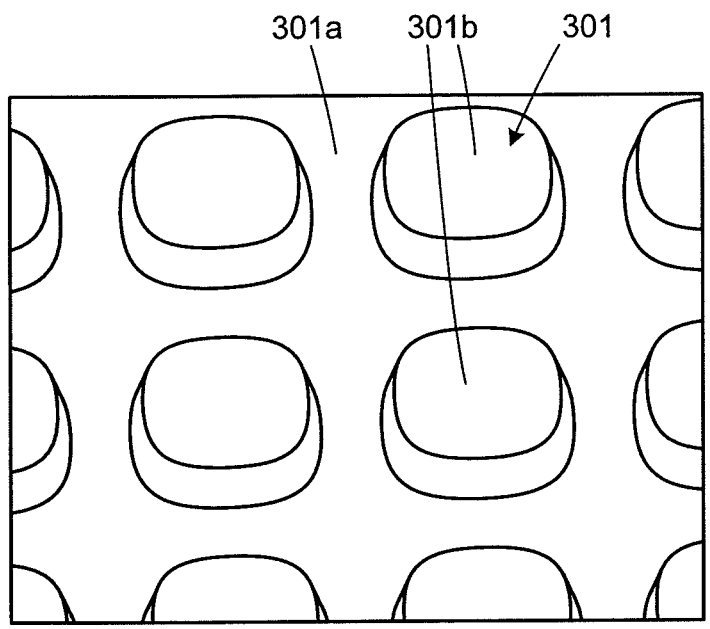
FIG. 4 is a perspective view of microbumps formed on the electrode.

At step (d), the resist films 303 are formed in circular shapes on a plane, for example. Thus, at step (e), circular microbumps 301b are formed on the bonding portions 111 and 112. FIG. 4 is a perspective view of microbumps formed on the electrode. Each of the microbumps 301b can be formed so as to have a diameter φ of about 8 μm, and the height of about 2 μm. According to the steps described above, the wiring patterns 120 (a necessary metal film), the bonding portions 111 and 112, and the microbumps 301b thereof can be formed efficiently on the substrate 100.

Figure 5:
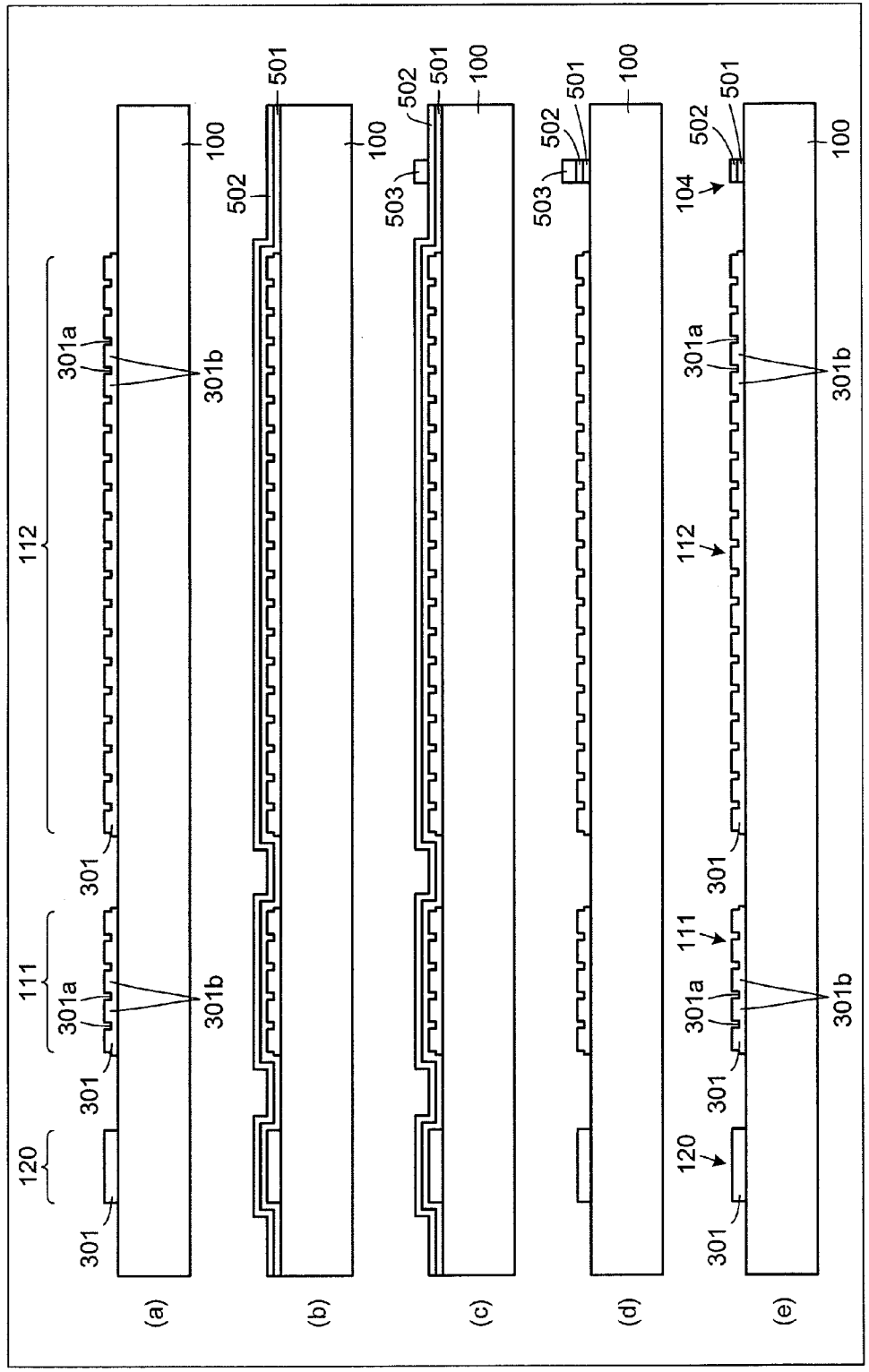
FIG. 5 is a diagram of an exemplary process of forming a waveguide on a substrate.

FIG. 5 is a diagram of an exemplary process of forming the waveguide on the substrate and depicts steps after the formation of microbumps depicted in FIG. 3. Step (a) depicts a state where the resist films 303 have been removed after step (e) in FIG. 3 and microbumps 301b have been formed on the bonding portions 111 and 112. At step (b), a silicon dioxide film 501 and a silicon nitride film 502 are formed on the entire surface of the substrate 100 by plasma CVD, for example.

At step (c), a resist film 503 is formed on the portion where the waveguide 104 is to be formed. At step (d), the silicon dioxide film 501 and the silicon nitride film 502 are removed by etching portions other than that for the waveguide 104. At step (e), the formation of the waveguide 104 using the silicon dioxide film 501 and the silicon nitride film 502 is completed by removing the resist film 503.

Surface-activated bonding is a bonding method employing the cohesion of atoms by activating the surface of a material by using, for example, plasma processing to remove an inactive layer such as an oxide film and contaminants covering the surface and bringing atoms having a high surface energy into contact with each other. However, even with this technology, heat above a certain level (100 to 150° C.) has to be applied to bond planar surfaces. To lower the temperature required for bonding, the present invention forms the microbumps 301b of Au, a deformable material having plasticity, on one of the surfaces, that is, on the bonding portions 111 and 112 of the substrate 100, thereby enabling bonding at room temperature.

The principle of surface-activated bonding is described. An oxide film and/or contamination are present on the actual surface (bonding portions 111 and 112, for example). Thus, the surfaces of the bonding portions 111 and 112 are activated by plasma cleaning and/or ion-beam sputter etching to expose atoms with unpaired electrons. Thus, the atoms can be bonded by simply contacting the electrodes of the driver IC and the wavelength conversion elements to be bonded with the bonding portions 111 and 112.

Components can be bonded on the substrate 100 at a room temperature by the surface-activated bonding technology described above. This surface-activated bonding does not use heat for bonding, and thus has the following advantages:
1. No destruction of components caused by residual stress due to the difference in the coefficient of thermal expansion
2. No heat stress to components and no functional degradation of components
3. No deviation of position at the time of implementation since no-heat and solid-phase bonding is used
4. No thermal effect to other components
5. No temporal degradation of the bonding layer due to direct bonding of atoms Exemplary coefficients of thermal expansion of materials of components that are disposed in a mixed manner on the substrate 100 are described. Generally, the coefficient of thermal expansion is a function of temperature; however, for simple comparison, values around room temperature are described.

Figure 6:
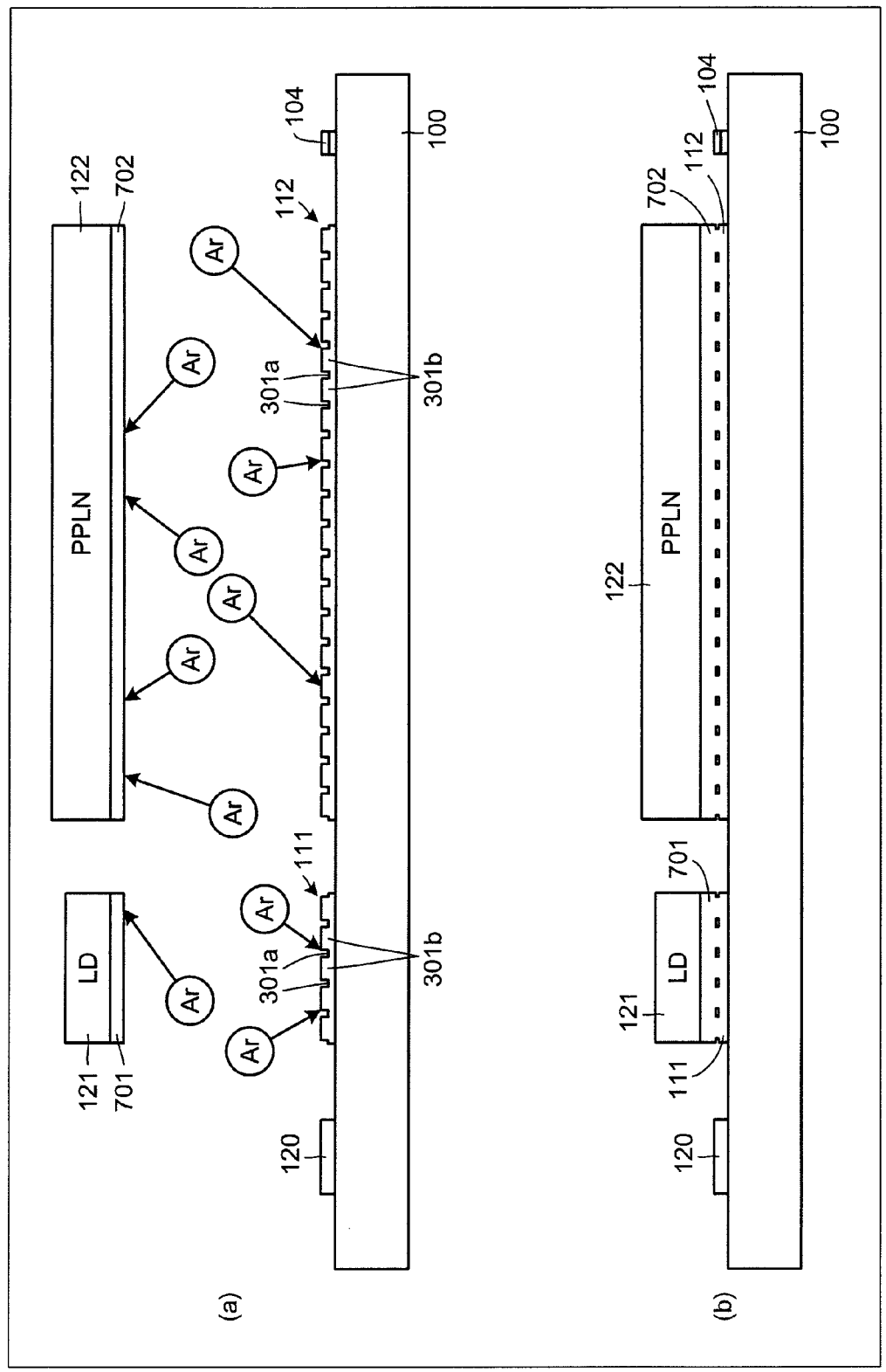
FIG. 6 is a schematic of component implementation by surface-activated bonding.

Material of LDs 121
GaAs: $5.7 \times 10^{-6}$/K
GaN: $5.6 \times 10^{-6}$/K
Material of Wavelength Conversion Elements 122
LiNbO$_3$: rate of thermal expansion along the X and Y axes is $1.54 \times 10\text{-}5^{-5}$/K, while rate of thermal expansion along the Z axis is $0.75 \times 10\text{-}5^{-5}$/K
Material of LSI for Data Processing, LD Driver (Driver IC 123), and Si Platform
Si: $4.2 \times 10\text{-}6^{-6}$/K FIG. 6 is a schematic of component implementation by the surface-activated bonding. The bonding portions 111 and 112 are formed on the substrate 100 and the microbumps 301b are formed on the bonding portions 111 and 112 through the steps described above. Then, the LDs 121 and the wavelength conversion elements 122 are bonded to the substrate 100 by the surface-activated bonding described above. At step (a), the bonding portions 111 and 112 of the substrate 100 and the electrodes of components such as the LDs 121 and the wavelength conversion elements 122 are subjected to argon plasma cleaning, and the surfaces thereof are activated. At step (b), the components can be implemented by positioning/contacting an electrode 701 of the LD 121 and an electrode 702 of the wavelength conversion element 122 on/with the bonding portion 111 and the bonding portion 112, respectively, and applying pressure to bond the components at a room temperature.

Figure 7:
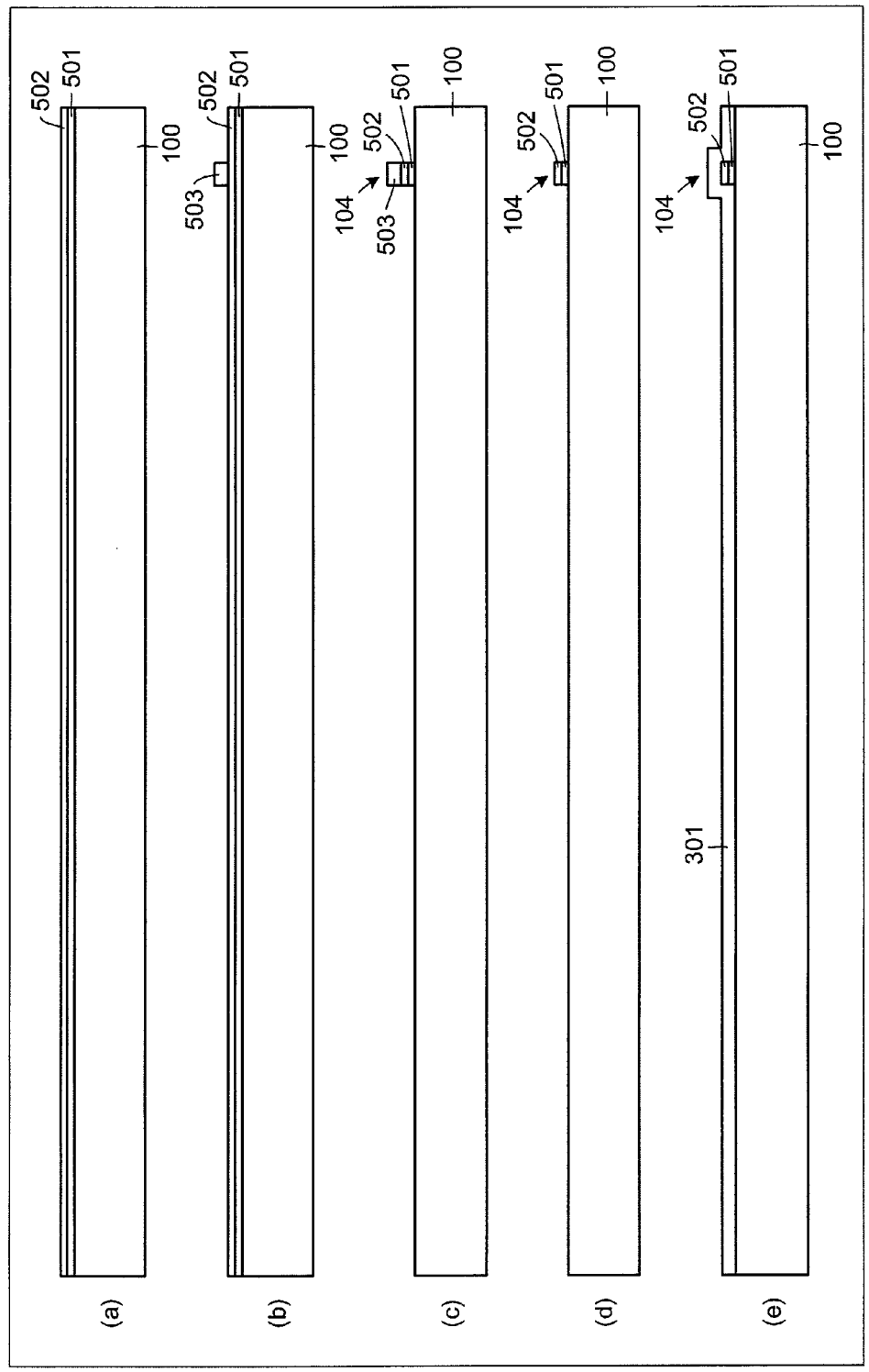
FIG. 7 is a diagram of a second example of the manufacturing process of forming the waveguide on the substrate.

In a second example of the manufacturing process, microbumps are formed after the waveguide is formed. FIG. 7 is a diagram of the second example of the manufacturing process of forming the waveguide on the substrate. In FIG. 7, elements similar to those described in the first example are assigned the same reference signs used in the first example. At step (a), a silicon dioxide film 501 and a silicon nitride film 502 are formed on the entire surface of the substrate 100 by plasma CVD, for example.

At step (b), a resist film 503 is formed on the portion where the waveguide 104 is to be formed. At step (c), the silicon dioxide film 501 and the silicon nitride film 502 are removed by etching portions other than that for the waveguide 104. Thereafter, at step (d), the formation of the waveguide 104 using the silicon dioxide film 501 and the silicon nitride film 502 is completed by removing the resist film 503. At step (e), the Au film 301 is formed on the substrate 100 of Si.

Figure 8:
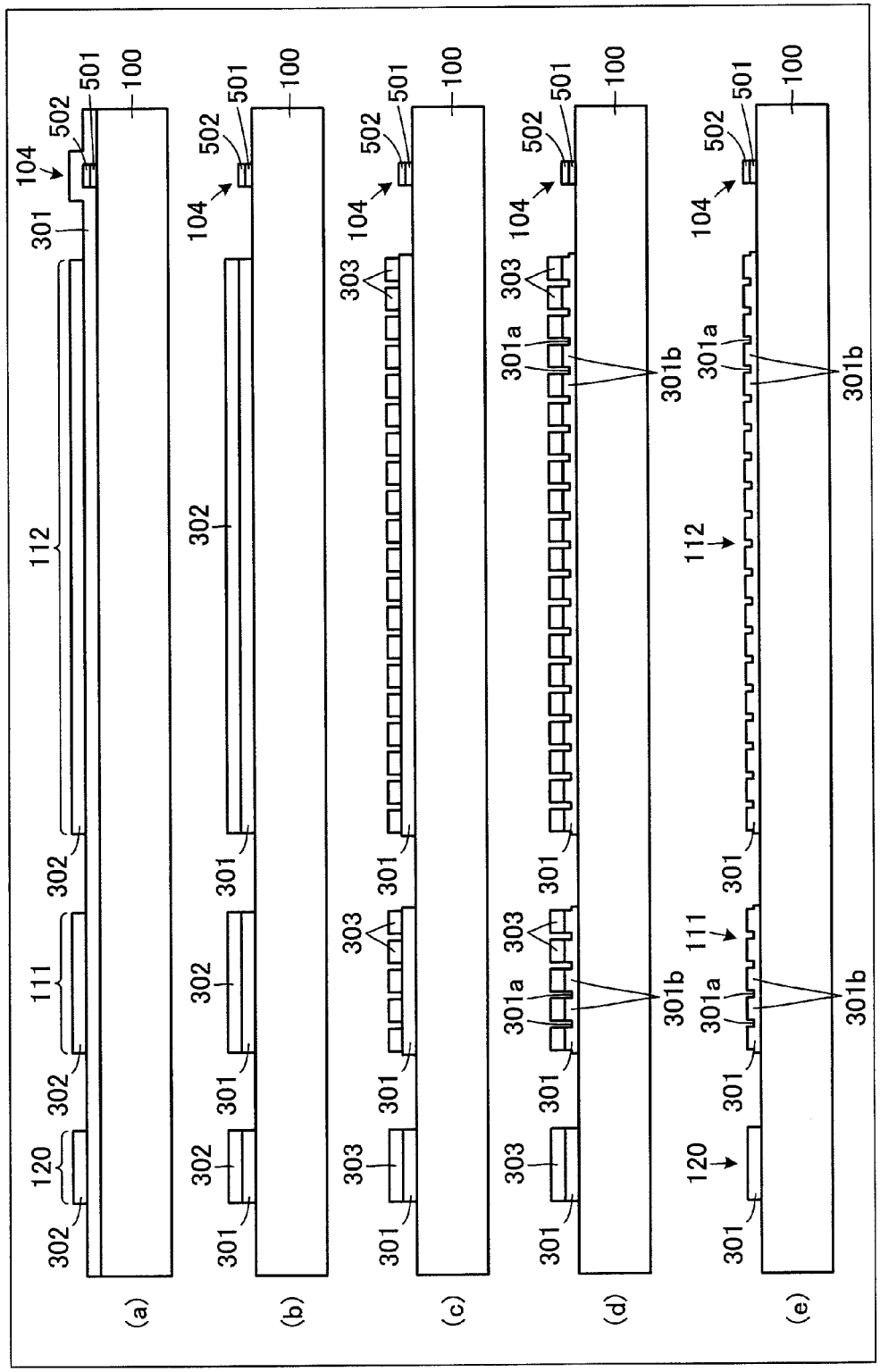
FIG. 8 is a diagram of an exemplary process of forming microbumps at the bonding portions.

FIG. 8 is a diagram of an exemplary process of forming microbumps at the bonding portions and depicts steps after step (e) in FIG. 7. At step (a), resist films 302 are formed on portions to remain as electrodes. The electrodes are the bonding portions 110, 111, and 112 described above and in the example depicted in the figure, correspond to the bonding portions 111 and 112 and the wiring patterns 120 depicted in FIG. 2.

At step (b), the Au film 301 is removed by etching portions not covered by the resist films 302, thereby forming electrodes. Here, the waveguide 104 formed using the silicon dioxide film 501 and the silicon nitride film 502 remains. Among the electrodes, on the bonding portions 111 and 112 where components are to be implemented, resist films 303 for microbumps are formed at step (c). Further, a resist film 303 is formed on the entire surface of the Au film 301 at the portion to remain as the wiring patterns 120.

Thereafter, at step (d), grooves 301a of a given depth are formed by half etching between resist films 303 on the bonding portions 111 and 112. After the resist films 303 are removed at step (e), microbumps 301b are formed on the bonding portions 111 and 112. The bonding portions 111 and 112 are entirely conductive as electrodes even after the formation of the microbumps 301b, since the underside of the microbumps 301b are connected by the Au film 301. The portion for the wiring patterns 120 remains planar since no microbumps are formed.

In the first and the second examples of the manufacturing process above, formation of the microbumps 301b on the substrate 100 along the A-A line of FIG. 2 is described, i.e., the formation of the microbumps 301b on the bonding portions 111 and 112 of the LDs 121 and the wavelength conversion elements 122, however, the microbumps 301b can be formed on the bonding portion 110 in a similar manner, that is, on the electrode where the driver IC 123 is disposed.

Figure 9:
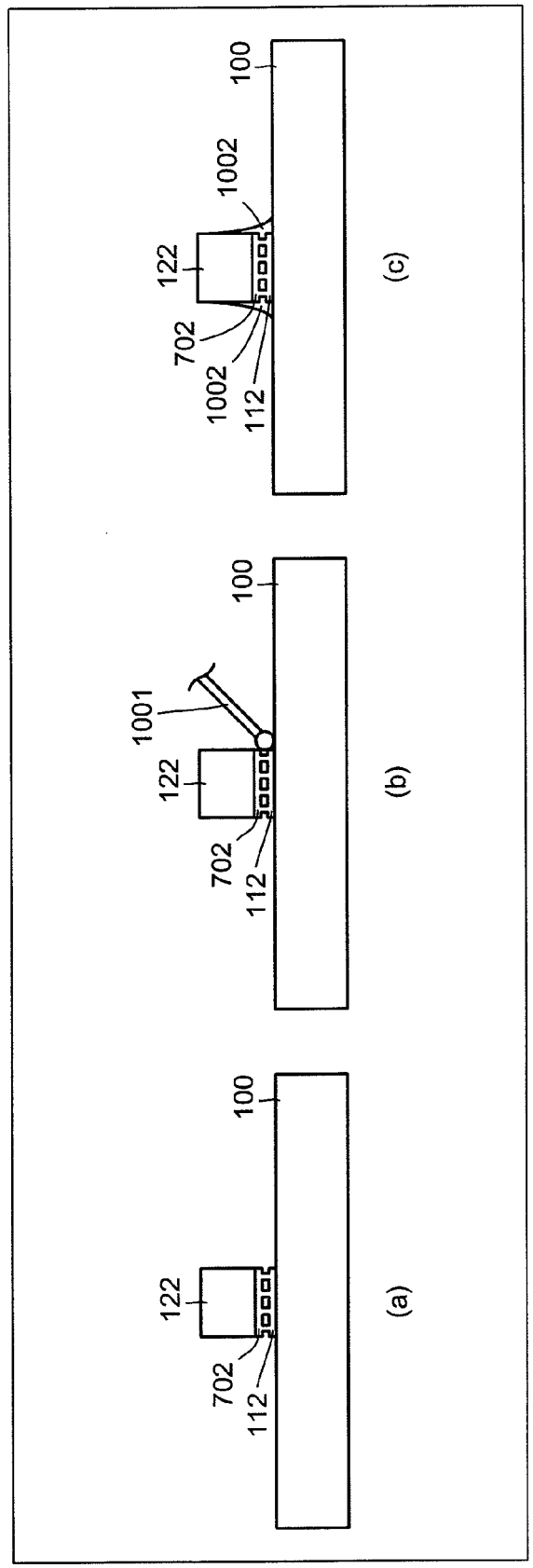
FIG. 9 is a diagram of a reinforcement process of a bonded portion.

The bonded state of the bonding portions bonded by the surface-activated bonding described above can be reinforced by applying resin. FIG. 9 is a diagram of a reinforcement process of the bonded portion, and depicts the portion around the wavelength conversion element 122 as viewed from the side.

Figure 10:
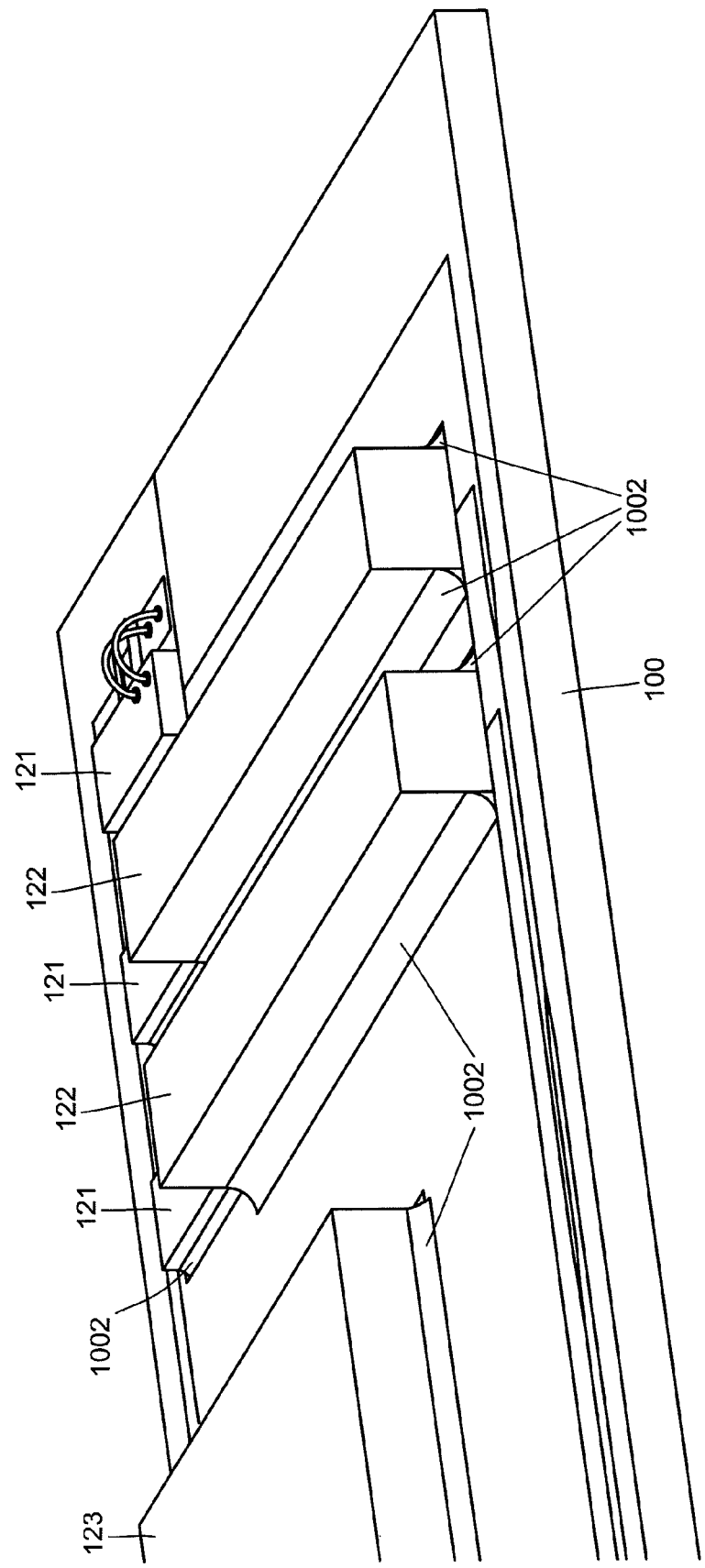
FIG. 10 is a perspective view of reinforcement of the bonded portion.

At step (a) in FIG. 9, the electrode 702 of the wavelength conversion element 122 is positioned on and contacted with the bonding portion 112, and bonded together. At step (b), resin (for example, UV resin) is applied by a dispenser 1001, for example, around the electrode 702 of the wavelength conversion element 122 and the bonding portion 112 on the substrate 100. At step (c), a resin fillet 1002 is formed from the side of the wavelength conversion element 122 to the surface of the substrate 100 so as to enclose the bonding portion 112 and the electrode 702. Thus, the wavelength conversion element 122 disposed on the substrate 100 can be more firmly bonded. In this figure, the bonding of the wavelength conversion element 122 is reinforced, however, the bonding of other component such as the LDs 121 and the driver IC 123 described above can be reinforced in a similar manner, if the component is disposed on the substrate 100 similarly as depicted in the perspective view of FIG. 10.

Figure 11:
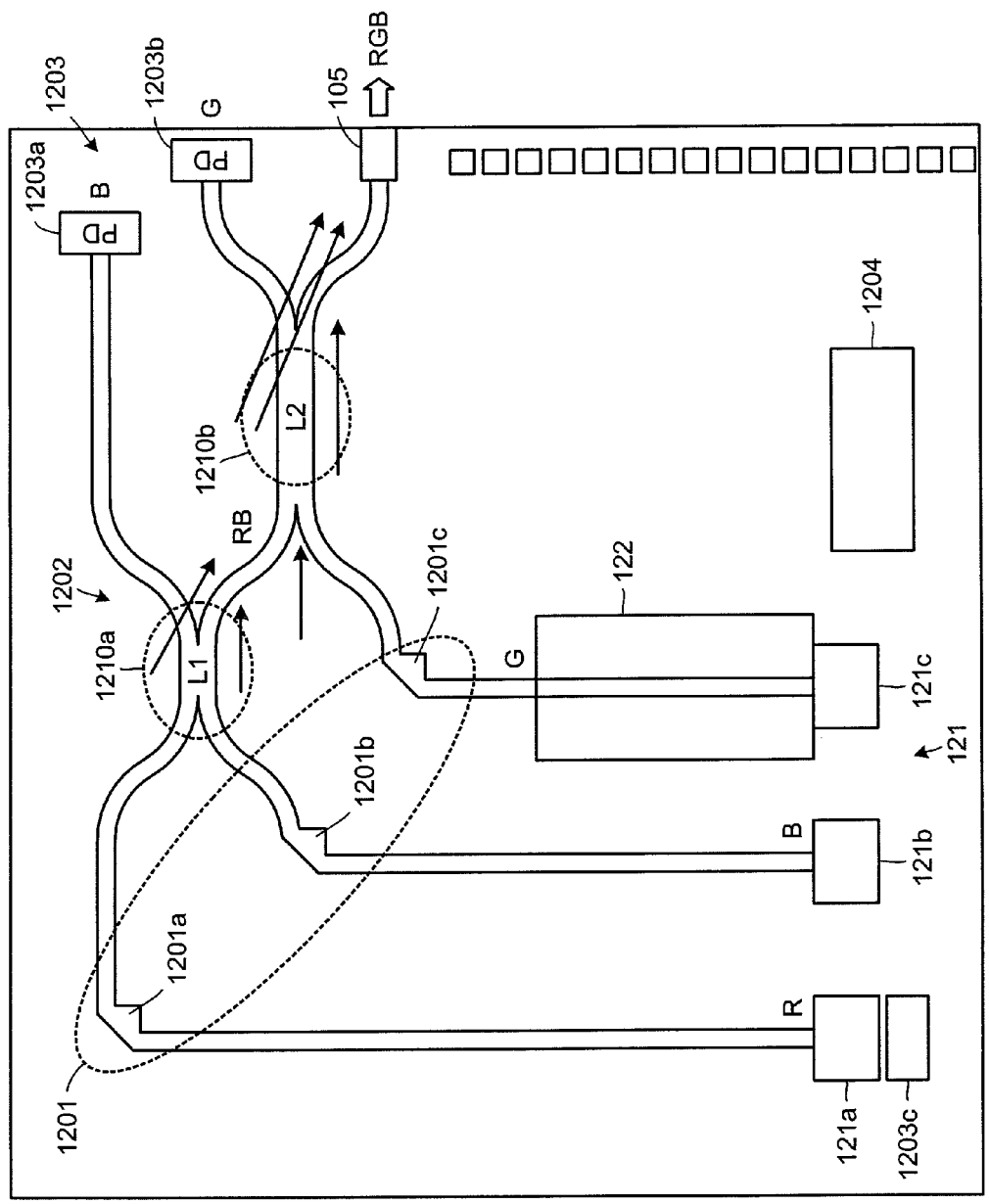
FIG. 11 is a plan view of the waveguide formed on the substrate.

FIG. 11 is a plan view of the waveguide formed on the substrate. For convenience, the scale of FIG. 11 is different from that of FIG. 2. As depicted in FIG. 11, LDs 121 (121a to 121c), 90° pitch converters 1201 (1201a to 1201c) also functioning as 90° benders, a wavelength multiplexer 1202, detectors 1203 (1203a and 1203b), and a controller 1204, etc., are arranged on the substrate 100. The wavelength multiplexer 1202 includes waveguide directional couplers 1210a and 1210b. For example, the LD 121a uses a semiconductor laser of AlInGaP (red; R), while the LD 121b uses a semiconductor laser of InGaN (blue; B). The LD 121c may use a direct emission-type LD of green (G); however, in the example depicted in the figure, an LD of GaAs (near-infrared light of 1064 nm, for example) is used and the wavelength conversion element 122 is arranged.

As depicted in FIG. 11, the interval between the waveguide directional couplers 1210a and 1210b of the wavelength multiplexer 1202 is significantly small compared to the intervals among the LDs 121a to 121c. Thus, to align the pitch of the waveguides on the side of the LDs 121 with that on the side of the wavelength multiplexer 1202, the 90° pitch converters 1201 (1201a to 1201c) also functioning as 90° benders are provided at the corners formed by the inputs to the wavelength multiplexer 1202 and the waveguides for connecting the LDs 121. These 90° pitch converters 1201 (1201a to 1201c) change the travelling directions of light by 90° degrees. The 90° pitch converter 1201 may include a resonance area therein; alternatively, the 90° pitch converter 1201 may not include any resonance area, and a simple 90° elbow waveguide may be used as the 90° pitch converter 1201.

The multiplexing of light performed by the wavelength multiplexer 1202 is described. In the waveguide directional coupler 1210, two waveguides are closely arranged in parallel over the coupling length. The wavelength multiplexer 1202 allows at least two different wavelengths to be input from two input ports, and multiplexes into an optical wave to be output from one output port, input waves selected according to wavelength selectivity. Optical waves of wavelengths that are not multiplexed are output from other output ports.

Specifically, as depicted in FIG. 11, the waveguide directional coupler 1210a of the first stage having the coupling length L1 is formed between adjacent two waveguides R and B among three waveguides connected to three LDs 121. The waveguide directional coupler 1210b of the second stage having the coupling length L2 is formed between the waveguide G and a waveguide into which R and B are merged. Lights R, G, and B of different wavelengths are input from the waveguides, respectively. The lights R and B of wavelengths λ1 and λ2 that are input from the LD 121a and the LD 121b, respectively, are multiplexed (merged) together by the waveguide directional coupler 1210a having the coupling length L1. The multiplexed lights R and B and the light G are multiplexed (merged) together by the waveguide directional coupler 1210b having the coupling length L2. The multiplexed lights R, G, and B are output from the port 105.

In the example depicted in the figure, the detector (PD) 1203a for monitoring the output of the blue (B) light is connected to the other output port of the waveguide directional coupler 1210a; the detector 1203b for monitoring the output of the green (G) light is connected to the other output port of the waveguide directional coupler 1210b; and the detector 1203c for monitoring the output of the red (R) light is arranged on the side of the backlight of the LD 121a.

The wavelength multiplexer 1202 described above has a simple configuration in which the waveguide directional couplers 1210 are merely cascaded, and gradually multiplexes input waves by merging optical waves of different wavelengths sequentially by the waveguide directional coupler 1210 of each stage. According to this configuration, optical waves of different wavelengths can be multiplexed without using an optical device for spatial separation such as a prism, thereby preventing an increase of the number of components and downsizing the device.

According to the integrated device described above, microbumps are formed on electrodes and by the surface-activated bonding, all optical elements and electrical elements that are components made of different materials can be easily disposed at a low temperature on the same planarized substrate on which a waveguide functioning as an optical line is formed.

Thus, according to the present invention, the strain of the substrate can be suppressed and a highly-precise implementation of components on a single substrate can be achieved without any concern about the thermal history, even if the difference in the coefficient of thermal expansion of the components are great such as the optical elements and electrical elements described above. Optical elements and electrical elements of different functions can be disposed in a mixed manner on the same substrate and the function of the integrated device can be improved, thereby improving the function of the integrated device, reducing the number of substrates of a device employing the integrated device, reducing the overall size of the device and the cost thereof, and improving the reliability.

If the substrate 100 of Si is configured to house another LSI, an integrated device into which more functions are integrated can be manufactured.

As described above, the integrated device according to the present invention is useful in mounting different components on the same substrate, and in particular, useful for a hybrid optoelectronic integrated circuit on which optical elements and electrical elements of different materials and coefficient of thermal expansions are disposed in a mixed manner, and for a projector, a communication module, advanced lightning, etc., employing the integrated device.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An integrated device in which an optical element and an electrical element are implemented on a substrate and a plurality of laser diodes, a plurality of wavelength multiplexers, and a plurality of 90° pitch converters are arranged on the substrate, wherein materials of the optical element and the electrical element have different coefficients of thermal expansion from each other, the optical element and the electrical element are bonded by surface-activated bonding technology to a bonding portion that is formed on the substrate and made of metal material, a bonding state of the bonding portion bonded by the surface-activated bonding technology is reinforced by resin, a waveguide is formed on the substrate and connected to the optical element directly, an interval between the plurality of wavelength multiplexers is small compared to an interval among the plurality of laser diodes, and the plurality of 90° pitch converters are provided at corners, formed by inputs to the plurality of wavelength multiplexers and waveguides for connecting the plurality of laser diodes, to align a pitch of the waveguides on a side of the plurality of laser diodes with that on a side of plurality of wavelength multiplexers.

2. The integrated device according to claim 1, wherein the bonding portion has a microbump structure.

3. The integrated device according to claim 1, wherein the metal material is Au.

4. The integrated device according to claim 1, wherein a laser element is bonded to the bonding portion as the optical element.

5. The integrated device according to claim 1, wherein a wavelength conversion element is bonded to the bonding portion as the optical element.

6. The integrated device according to claim 1, wherein a light receiving element is bonded to the bonding portion as the optical element.

7. The integrated device according to claim 1, wherein the substrate is a silicon substrate.

8. The integrated device according to claim 7, wherein the silicon substrate includes an integrated circuit.

\* \* \* \* \*